United States Patent [19]

Mitsutsuka

[11] Patent Number: 4,967,113

[45] Date of Patent: Oct. 30, 1990

[54] SURFACE-ACOUSTIC-WAVE CONVOLVER

[75] Inventor: Syuichi Mitsutsuka, Tokyo, Japan

[73] Assignee: Clarion Co., Ltd., Tokyo, Japan

[21] Appl. No.: 325,384

[22] Filed: Mar. 17, 1989

[30] Foreign Application Priority Data

Mar. 24, 1988 [JP] Japan .................................. 63-71469
Apr. 6, 1988 [JP] Japan .................................. 63-83167

[51] Int. Cl.$^5$ .............................................. H01L 41/08

[52] U.S. Cl. ........................... 310/313 R; 310/313 A; 310/313 D; 364/821

[58] Field of Search ................ 310/313; 333/193–196, 333/150–155; 364/821

[56] References Cited

U.S. PATENT DOCUMENTS 4,600,853 7/1986 Whitlock et al. ........... 310/313 R X
4,611,140 9/1986 Whitlock et al. ........... 310/313 R X
4,683,395 7/1987 Mitsutsuka et al. ........ 310/313 D X
4,757,226 7/1988 Mitsutsuka et al. ........ 310/313 R X

*Primary Examiner*—Mark O. Budd
*Attorney, Agent, or Firm*—Flynn, Thiel, Boutell & Tanis

[57] ABSTRACT

In a SAW convolver having a multi-layer structure consisting of a piezoelectric layer, insulation layer and semiconductor layer and having at least one comb-shaped electrode fed with an input signal and a gate electrode for exerting a convolution output, an interface in the form of a jaggedness is formed between the insulation layer and the semiconductor layer to improve the convolution efficiency.

42 Claims, 13 Drawing Sheets

SURFACE-ACOUSTIC-WAVE CONVOLVER

FIELD OF THE INVENTION

This invention relates to an improved arrangement of a monolithic surface-acoustic-wave (hereinafter abbreviated as "SAW") convolver consisting of piezoelectric and semiconductive layers.

BACKGROUND OF THE INVENTION

FIGS. 13 and 14 show first and second prior art arrangements. In FIGS. 13 and 14, reference numeral 1 refers to a piezoelectric film, 2 to an insulator, 3 to a semiconductive epitaxial layer, 4 to a p-type or n-type semiconductor, 5 to an n-type or p-type semiconductor, 6 to an $n^+$-type or $p^+$-type semiconductor substrate, 7 to a gate electrode, 8 to a bottom electrode, 9 to a comb-shaped electrode, 10 to a bias source, 11 to an input terminal, and 12 to an output terminal.

The first prior art convolver (FIG. 13) is of a monolithic structure, which is manufactured easily and has quite a high convolution efficiency. Its details are given by the following document:

DOCUMENT 31

S. Minagawa, et al.
"Efficient ZnO-$SiO_2$-Si Sezawa Wave Convolver", IEEE Trans. Sonics Ultrason., vol. Su-32, No. 5, September 1985, pp 670–674

This convolver exhibits a high convolution efficiency when its semiconductor surface is in a depletion condition or in a weak inverted condition. Therefore, in practical use thereof, a d.c. bias voltage must be applied to the gate electrode 7 so that the semiconductor surface becomes the said condition. Such a bias voltage is affected by the impurity density of the semiconductor, the interface level density and the ambient temperature. The influence of temperature is particularly important, and the operative bias range causing a high value of convolution efficiency largely varies with temperature in most cases. For example, also when the operative bias range is above several volts, under a high temperature around 80° C. the operative bias range sometimes becomes 1 volt or less.

On the other hand, the second prior art arrangement (FIG. 13) is a SAW convolver operative at zero bias (hereinafter called zero-bias type SAW convolver). It has an arrangement of p-type semiconductor/n-type semiconductor/$n^+$-type semiconductor or an arrangement of n-type semiconductor/ p-type semiconductor/p+-type semiconductor in the semiconductor side, and the impurity density and the film thickness of the upper-located semiconductor layer 4 (p-type semiconductor in the former arrangement and n-type semiconductor in the latter arrangement) are selected to change the entire semiconductor layer 4 into a depletion layer under zero bias ($V_B$=OV). Since a monolithic SAW convolver consisting of a piezoelectric member and a semiconductor, in general, exhibits a high convolution efficiency when the semiconductor surface is in a depletion condition or in a weak inverted condition, the said condition of the semiconductor layer 4 makes it possible to activate the convolver of FIG. 14 in a high convolution of efficiency also under zero bias. The nature of being operative under zero bias indicates that the exterior bias source 10 is substantially not required and that the prior art structure of FIG. 14 contributes to a scale reduction of the peripheral circuit and to a cost reduction. A detailed explanation is given by the following documents:

DOCUMENT [1]

Japanese Patent Application No. 60-202845
"Surface-Acoustic-Wave Convolver"
Inventor: Syuichi Mitsutsuka
Applicant: Clarion Co., Ltd.

DOCUMENT [2]

Mitsutsuka, et al.
"Experimental Trial of Zero-bias Operative Type Monolithic ZnO/Sihd 2/Si Convolver"
Autumn, 1976, Preliminary Manuscripts for Applied Physics Academy Lecture, p.905

When the bias $V_B$ of FIG. 14 is varied, the convolution efficiency of the convolver also varies accordingly, and the bias range causing a high convolution efficiency (hereinafter called "operative bias range") corresponds to a bias which changes the semiconductor surface into a depletion condition or a weak inverted condition. When the semiconductor surface becomes an accumulation condition, the non-linear efficiency of the semiconductor drops, and the convolution efficiency also drops accordingly. When the semiconductor surface becomes an inverted condition, the current in the inverted charge layer causes the Joule heat, and hence increases the propagation loss of the surface acoustic waves, which results in a large drop in the convolution efficiency. Since the operative bias range depends on the surface condition of the semiconductor as discussed above, it is affected by the impurity density of the semiconductor, the interface level density and the ambient temperature. Therefore, in order to realize such a zero bias operation of the arrangement of FIG. 14, it is essential that the zero bias ($V_B$=OV) is held in the operative bias range, regardless of possible changes in the operative bias range with the said factors. For this purpose, the semiconductor 4 must have an appropriate impurity density and thickness determined properly in view of the said factors. Affection of the temperature is particularly important. For example, in the arrangement of ZnO/$SiO_2$/Si, the operative bias range is sometimes decreased under a high temperature around 80° C., also when the operative bias range is above several volts in the room temperature. Therefore, in order to ensure the zero bias operation in a wide temperature range, it is necessary to set a more strict condition of the semiconductor layer 4 of FIG. 14.

Further, since a d.c. bias voltage must be applied to the gate electrode 7 in the first prior art arrangement of FIG. 13, which causes infiltration of electric charges into the piezoelectric film 1, it sometimes takes a long time to stabilize the characteristic of the device. It is understood that this is caused by the fact that charges in the piezoelectric film are caught or discharged due to the existence of traps or interface level in the piezoelectric film or along the interface between the piezoelectric film and the insulator and that a long time is required until the entire charge distribution is balanced.

In order to overcome these drawbacks, there is a proposal to apply a bias voltage directly to the semiconductor substrate 3 and not through the piezoelectric film. This is a method proposed by Arimoto, et al. of Tokyo Institute of Technology. FIGS. 23 and 24 show such arrangements of Arimoto, et al. Detailed explanation thereof is given by the following document:

DOCUMENT [4]

Y. Arimoto, et al.
"ZnO/Si SAW convolver with surface-controlling junctions"
Applied Physics Letters, Vol. 31 No. 2, 15 July, 1977, pp 63–65

In FIGS. 23 and 24, the piezoelectric film 1 is made from ZnO, the insulator 2 from $SiO_2$, and the semiconductor substrate 3 from p-type Si. Reference numeral 20 designates control electrodes ($n^+$-Si), and 21 refers to a control bias source.

In the arrangements of FIGS. 23 and 24, in a portion between the insulator and the semiconductor, control electrodes 20 are provided at predetermined intervals, and a bias voltage $V_J$ is applied to the control electrodes to directly control the surface condition of the semiconductor. Arimoto, et al. use control electrodes 20 in the form of $n^+$-Si made by diffusion into the p-type Si substrate. The convolution output is extracted from the gate electrode 7 located on the piezoelectric film (ZnO film)as in the former technologies. In this arrangement, since a bias is applied not through the piezoelectric film (ZnO film) 1, the above-pointed drawbacks are removed, the convolver output has an immediate-response characteristic to a control bias, and the characteristic of the device is stabilized in a short time.

As described above, both in the first and second prior art arrangements, the operative bias range is affected by the impurity density of the semiconductor and the interface level density. Therefore, it is often difficult to realize a desired operative bias, and the manufacturing yield is decreased in many cases.

Therefore, the first prior art arrangement of FIG. 13 has drawbacks that the manufacturing yield decreases particularly when manufacturing elements operative under zero bias in a wide temperature range and that the manufacturing cost is increased accordingly.

In the arrangements of FIGS. 23 and 24, the surface condition of the semiconductor 3 is readily inverted, and a charge layer of minority carriers is often produced along the semiconductor surface. Existence of such a minority carrier layer causes a current to flow therethrough and causes a loss by the Joule heat, which in turn causes an increase in the propagation loss of surface acoustic waves travelling through the convolver. Therefore, the said arrangements cannot prevent a decrease of the convolution efficiency of the convolver, and it is difficult to realize as high efficiency as obtained in the arrangement of FIG. 13.

Therefore, none of the aforegoing prior art arrangements satisfy both a high convolution efficiency and an immediate response to a bias.

OBJECT OF THE INVENTION

It is therefore a first object of the invention to provide a monolithic SAW convolver which has a wide operative bias range and improves the manufacturing yield, thereby overcoming the drawbacks of the first prior art.

A second object of the invention is to provide a monolithic SAW convolver which is operative under zero bias and has a wide bias range under a wide temperature range, thereby overcoming the drawbacks of the second prior art.

A third object of the invention is to provide a SAW convolver which has a high convolution efficiency and whose characteristic is stabilized in a short time with respect to a bias.

SUMMARY OF THE INVENTION

In order to attain the objects, a first invention is a surface-acoustic-wave convolver comprising a multi-layer arrangement of piezoelectric member/insulator/semiconductor including at least one comb-shaped electrode and a gate electrode located on the piezoelectric member, said convolver being particularly characterized in that it includes a meandering or jagged interface between the insulator and the semiconductor.

A second invention is a surface-acoustic-wave convolver comprising a multi-layer arrangement of piezoelectric member/insulator/first conduction type semiconductor/second conduction-type semiconductor/-high-concentrated second conduction type semiconductor including at least one comb-shaped electrode and a gate electrode located on the piezoelectric member, said convolver being characterized in that it includes a meandering or jagged interface between the insulator and the semiconductor.

A third inventive arrangement of SAW convolver is characterized in that it includes a meandering or jagged interface between an insulator and a semiconductor, and a control electrode array consisting of electrodes formed along the interface at portions where the insulator is thin.

The operative bias range in the prior art arrangements of FIGS. 13 and 14 corresponds to a condition where the semiconductor surface is changed to a depletion condition or a weak inverted condition. When a bias is applied so that the semiconductor surface becomes an inverted condition in the prior art arrangements, an uniform or even inverted charge layer 13 is produced along the semiconductor surface as shown in FIG. 4(*a*), and a current flows in the inverted layer due to a surface wave potential. As a result, a loss caused by the Joule heat occurs in the inverted layer, and the propagation loss of surface waves is increased largely. Therefore, the convolution efficiency is decreased largely in the inverted condition in the prior art arrangements. FIG. 4 shows an example in case of an n-type semiconductor.

On the other hand, in the inventive meandering or jagged structure, distribution of inverted charges in the inverted condition is not uniform throughout the semiconductor surface, but exhibits the configuration of FIG. 4(*b*) where inverted charges are caged in insulator offset portions.

In particular, when the meandering interval P is small, the caging effect is large, and the charges are biased deeply toward the inverted side, so that also under a higher temperature, the inverted layer is formed in the insulator offset portions and a wide operative bias range is obtained.

One of large differences between the invention and the prior art of FIG. 24 lies in how to arrange the control electrodes. More specifically, in the prior art arrangement of FIG. 24 periodical control electrodes are provided under the insulator ($SiO_2$ film) of a uniform thickness. In contrast, the present invention is characterized in that the control electrodes are provided under the insulator having periodical meandering margin and at thin insulator portions (at portions where the insulator is offset toward the piezoelectric film as viewed from the semiconductor). As will be described later, the inventive meandering or jagged structure can efficiently remove minority carriers produced along the semiconductor surface, and therefore realizes a higher convolution efficiency than that of the prior art arrangement.

DETAILED DESCRIPTION

Figure 1:
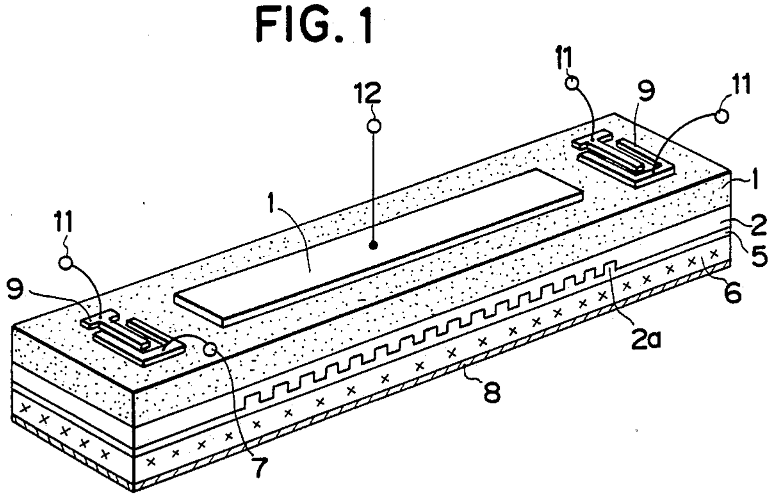
FIG. 1 is a perspective view of a surface-acoustic-wave convolver embodying the invention.

The invention is described below in detail, referring to some embodiments illustrated in the drawings. FIG. 1 is a cross-sectional view of a surface-acoustic-wave convolver corresponding to the first invention. In the drawing, the same reference numerals as those of FIG. 13 denotes the identical or equivalent elements to those of FIG. 13.

In FIG. 1, a difference from the first prior art arrangement lies in that the thickness of the insulator 2 varies so that the interface between the insulator and the semiconductor exhibits a jaggedness 2*a*. The jaggedness 2*a* is formed under the gate electrode 12 of the convolver and meanders along the same direction as the travelling direction of surface waves. The intervals of the jaggedness 2*a* need not be constant on the element. However, it is set at the following value with respect to the wavelength λ of a surface wave on the convolver.

$$m\cdot\lambda/2<P<(m+1)\cdot\lambda/2 \ldots \quad (1)$$

$(m=0,1,2,3\ldots\ldots\ldots\ldots\ldots\ldots)$ where P is the interval of the jaggedness. Expression (1) is a condition for preventing that a surface wave on the element is reflected intensively by the jaggedness. The jaggedness 2*a* may be viewed as a plurality of uniformly spaced, elongate parallel ribs which project upwardly from the semiconductor 5 and extend perpendicular to the direction of surface acoustic wave travel, and a plurality of groovelike recesses in the inderside of the insulator 2 which each receive a respective rib.

Various materials may be used for the piezoelectric film 1, insulator 2 and semiconductor used in the invention, 3 as in the first prior art arrangement. For example, ZnO, AlN, etc. may be used as the piezoelectric film 1 $SiO_2$, SiNx etc. may be used as the insulator, and Si, GaAs, etc. may be used as the semiconductor.

Figure 2:
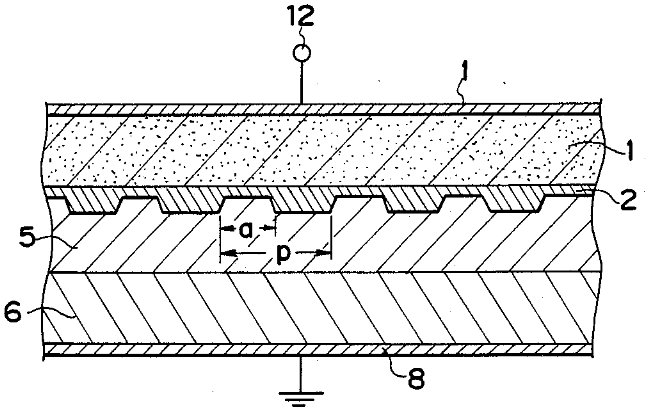
FIG. 2 is a cross-sectional view for explaining the theory of the embodiment of FIG. 1.

The semiconductor substrate 3 may be an epitaxial substrate (n/n+ substrate or p/p+ substrate) which is formed by an epitaxial growth of a low-concentrated semiconductor on a high-concentrated semiconductor as shown in FIG. 2. The propagation loss of surface waves travelling through the convolver is smaller in the use of the epitaxial substrate as shown in FIG. 2 than in the use of a bulk substrate, and as a result, the convolution efficiency is larger when the epitaxial substrate is used. Therefore, the use of the epitaxial substrate as shown in Figure is more advantageous practically.

Figure 3A:
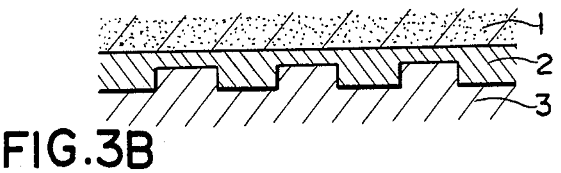
FIG. 3 is a cross-sectional view which shows a meandering or jagged configuration of the interface between an insulator and a semiconductor in the same embodiment.
Figure 3B:
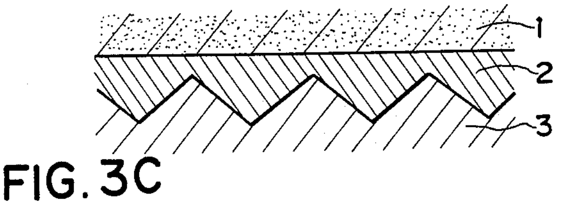
Figure 3C:
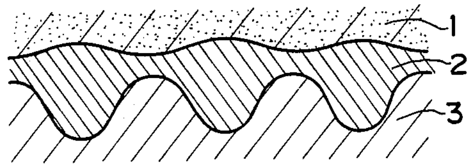

The configuration of the jaggedness 2*a* may be any one of various configurations as shown in FIGS. 3(*a*), (*b*) and (*c*). In most normal manufacturing processes, a configuration as shown in FIG. 3(*c*) is obtained easily rather than straight-line configurations as shown in FIGS. 3(*a*) and (*b*). It is noted that any other configuration other than those shown in FIG. 3 which defines a jagged or meandering interface between the insulator and semiconductor may be employed as the jagged pattern 2*a*.

The above-described embodiment operates as described below.

The first explanation is directed to why the interface between the insulator and the semiconductor is formed in a jagged or meandering configuration.

Figure 4A:
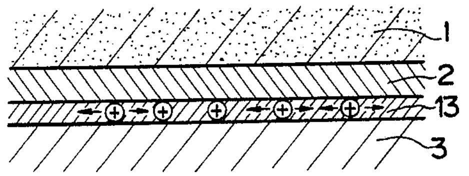
FIG. 4 and FIG. 5 are cross-sectional views which show how an inverted charge layer is generated.
Figure 4B:
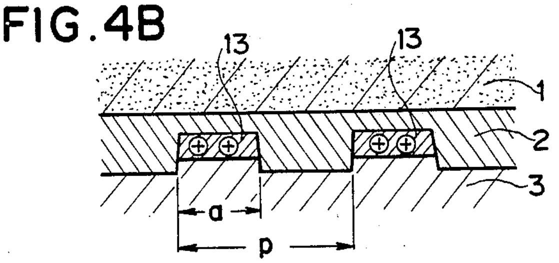
Figure 13:
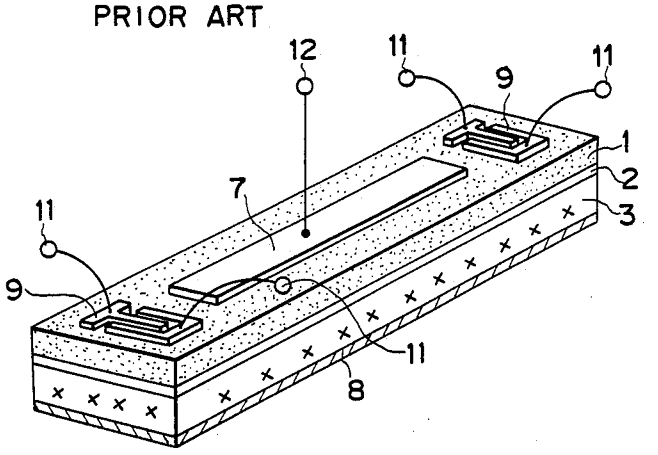
FIG. 13 PRIOR ART
FIG. 13 is a perspective view of a prior art surface-acoustic-wave convolver.

As described above, the operative bias range of the prior art arrangement of FIG. 13 corresponds to a depletion condition or a weak inverted condition of the semiconductor surface. In this prior art arrangement, when a bias for changing the semiconductor surface into an inverted condition is applied, a uniform inverted charge layer is produced along the surface of the semiconductor 3 as shown in FIG. 4(*a*), and a current flows in the inverted layer due to a potential of a surface wave. As a result, a loss caused by the Joule heat occurs in the inverted layer, and the propagation loss of the surface wave largely increases. Therefore, in the prior art arrangement of FIG. 13, the convolution efficiency is significantly decreased in the inverted condition. It is noted that FIG. 4 shows an example in case of an n-type semiconductor.

Figure 5A:
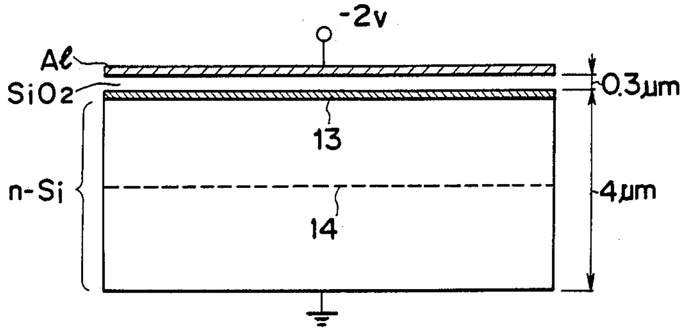
Figure 5B:
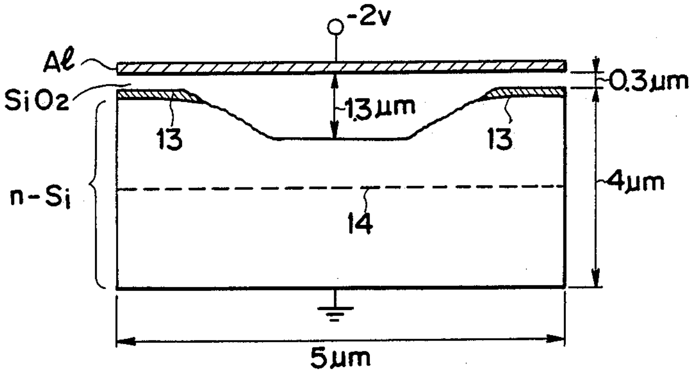
Figure 5C:
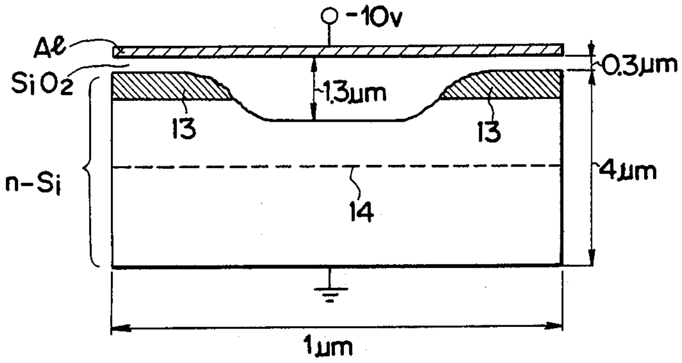

On the other hand, in the jagged configuration as used in the aforegoing embodiment, it is recognized that distribution of inverted charges in the inverted condition is not an even distribution along the semiconductor surface but exhibits as if charges are caged in selected portions where the insulator is thin or offset as shown in FIG. 4(*b*). As particular examples, FIG. 5 shows different forms of distribution of inverted charges of a SAW convolver of $Al/SiO_2/n$-Si structure which were obtained s a result of simulation. FIGS. 5(*b*) and (*c*) each show one period portion when assuming that the jagged structure is periodical and assuming that the donor density of n—Si is $2\times10^{14}cm^{-3}$. As will be understood from comparison between FIG. 5(*a*) of the prior art and FIGS. 5(*b*) and (*c*) of jagged structures, inverted charges (minority carriers) in each jagged structure are distributed as if they were caged in selected portions where the insulator 2 ($SiO_2$) is offset and thin. When in particular the jagged interval P is small as shown in FIG. 5(*c*), the caging effect is great, i.e. the charges are biased deeply to the inverted side. Also under a higher temperature, the inverted layer is formed mainly in the portions where the insulator 2 is offset and thin. Although a practical convolver includes a piezoelectric film 1 between the insulator (e.g., $SiO_2$) and metal (e.g. Al) of FIG. 5, the caging effect is substantially equal to FIG. 4.

Figure 6:
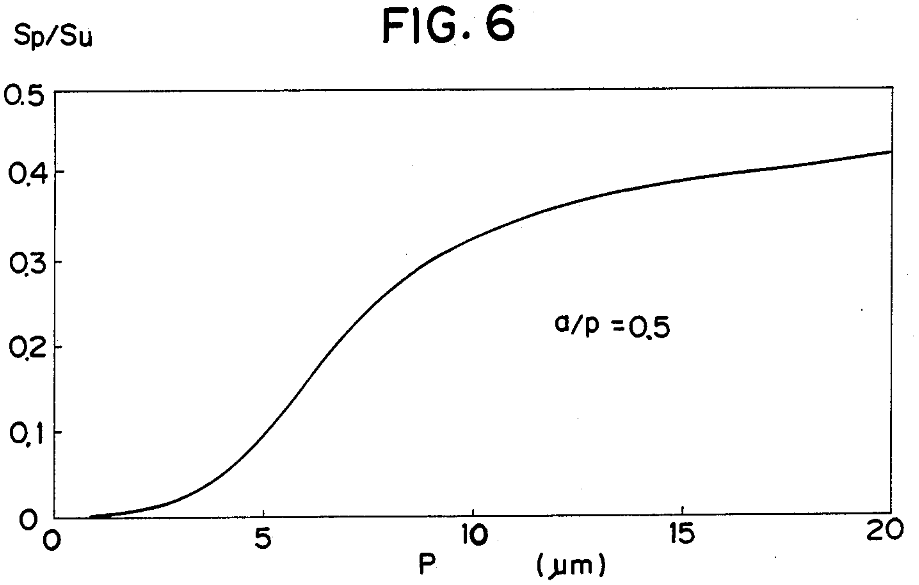
FIG. 6 is a graph which shows the loss in the inverted charge layer.

When inverted charges are caged as described above, it is difficult for the inverted charges to move with respect to the surface potential, and as a result, the Joule heat generated in the inverted charge layer is decreased as compared to the prior art arrangement. FIG. 6 shows a result of comparison between the loss (Sp) in a jagged structure and the loss (Su) in the prior art arrangement both generated in respective inverted charge layers. More specifically, FIG. 6 shows the relationship between the jagged interval P and the loss ratio Sp/Su in an example where the length a of each region where inverted charges are caged is a=0, inverted charges are positive holes, the semiconductor is Si, the frequency of the surface wave is 215 MHz, and the wavelength is 24 μm. As shown in FIG. 6, the loss Sp in the jagged structure is smaller than the loss Su in the prior art arrangement, and the Sp/Su is diminished as the jagged interval P becomes smaller. This indicates that the loss generated in the inverted layer can be decreased by diminishing the jagged interval P.

Figure 7:
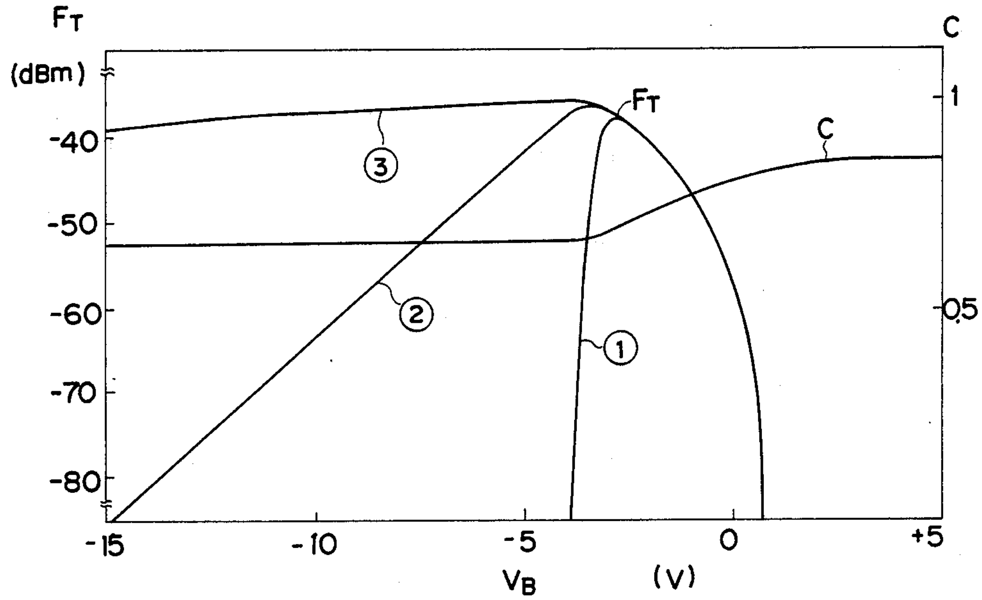
FIG. 7 is a graph which shows the convolution efficiency and the capacity with respect to a bias voltage.

FIG. 7 shows the relationship between the bias voltage and the convolution efficiency $F_T$ in a structure of $ZnO/SiO_2/n$-Si which is a result of simulation for obtaining the bias characteristic of the convolution efficiency $F_T$ of a convolver, considering such a decrease in the loss. In the same drawing, the C-V characteristic (capacitance-voltage characteristic) of the gate electrode in the prior art arrangement is also shown for comparison. In this example, the donor density of Si is $2\times10^{14}$cm−3, and the length of the gate electrode 1 is 40 mm. Further, the surface wave is Sezawa wave, and the frequency is 215 MHz. The convolution efficiency $F_T$ is defined by the following expression:

$$F_{T}=P_{out}=P_1=P_2 \quad (2)$$

where $P_1$ and $P_2$ are input power to comb-shaped electrodes, and $P_{out}$ is output power from the gate electrode. All amounts are shown in dBm. In FIG. 7, 1 indicates the characteristic in the prior art arrangement, 2 indicates the characteristic of a jagged structure of a=1 μm and p=2 μm, and 3 indicates the characteristic of a jagged structure a=5 μm and p=1 μm. It is evident from FIG. 7 that each inventive jagged structure has a high convolution efficiency also under a bias voltage $V_B$ which is deep in the inverted side, as compared to the prior art arrangement, and that a high $F_T$ is maintained under a deeper bias as the jagged interval becomes smaller. Therefore, the inventive jagged interface between the insulator and the semiconductor makes it possible to significantly enlarge the operative bias range as compared to the prior art arrangement. When the operative bias range expands, bias adjustment is easy also when the device is operated in a wide temperature range, and strict bias adjustment required in the prior art arrangement is not necessary. Further, the nature that the operative bias range is wide gives an advantage that the convolution output is not changed largely upon changes in the circumstances other than the temperature, changes of the element with time, changes in the output of the external bias circuit, etc. Therefore, the jagged structures not only facilitate bias adjusting processes but also contribute to stabilization of the convolution output.

As described above, various materials can be selected for the piezoelectric film, insulator and semiconductor used in the aforegoing embodiment. However, in order to increase the electromechanical coupling coefficient of a surface wave travelling through the convolver and to increase the convolution efficiency accordingly, an arrangement of $ZnO/SiO_2/n$-Si where the surface wave propagating mode is Sezawa wave is preferable. In this case, (110)-surface of Si with [100]-direction of propagation of a surface acoustic wave is quite advantageous because it particularly increases the electromechanical coupling coefficient. (100)-surface of Si with 110]-direction of propagation of a surface wave also establishes quite a large electromechanical coupling coefficient, and it is therefore an advantageous condition next to the said condition.

Figure 8:
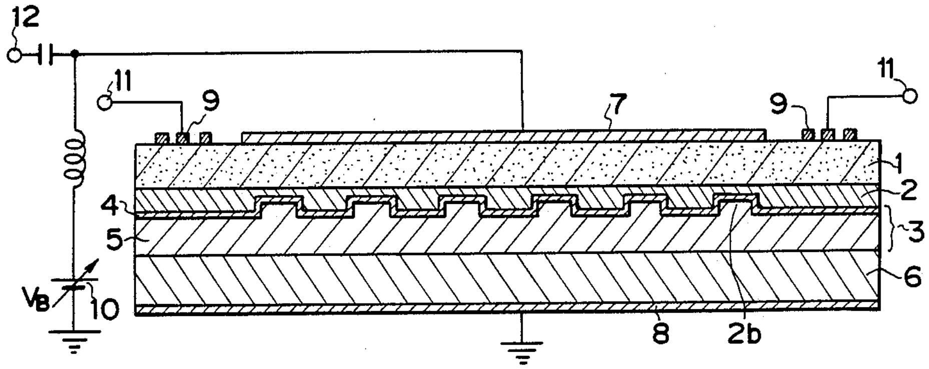
FIG. 8 is a cross-sectional view of a surface-acoustic-wave convolver taken as a second embodiment of the invention.
Figure 14:
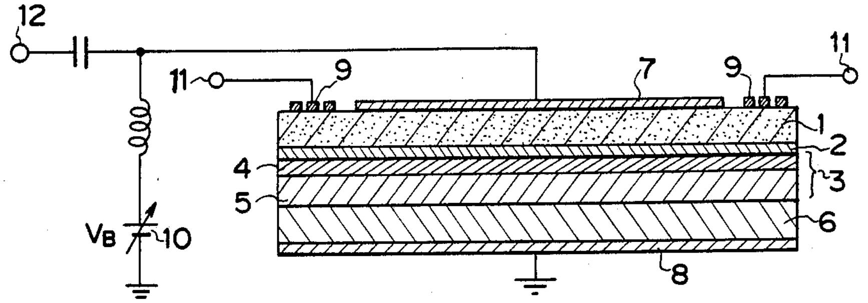
FIG. 14 PRIOR ART
FIG. 14 is a cross-sectional view of a further prior art surface-acoustic-wave convolver.

FIG. 8 shows a SAW convolver taken as an embodiment corresponding to the second invention where the arrangement of the semiconductor side consists of p-type semiconductor/n-type semiconductor/$n^+$-type semiconductor arrangement or consists of n-type semiconductor p-type semiconductor/$p^+$-type semiconductor arrangement as in the prior art arrangement of FIG. 14. However, in the embodiment of FIG. 8, unlike the prior art arrangement, the thickness of the insulator 2 varies to configure the interface between the insulator and the semiconductor in the form of a jaggedness 2*b*, and the upper-most semiconductor layer 4 is provided along the jaggedness 2*b*. The jaggedness is formed under the gate electrode 7 of the convolver so as to meander along the same direction as the surface wave travelling direction. The jagged interval is not necessarily required to be constant on the element, but it is set at a value shown in Expression (1) with respect to the wavelength λ of a surface wave on the convolver.

Each of piezoelectric film, insulator and semiconductor in the above-indicated embodiment may be made from any selected one of various materials as in the prior art arrangement of FIG. 14.

Figure 12A:
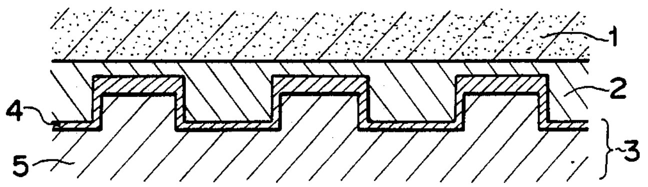
FIG. 12 is a cross-sectional view which shows a meandering or jagged configuration of the interface between an insulator and a semiconductor in the embodiment of FIG. 8.
Figure 12B:
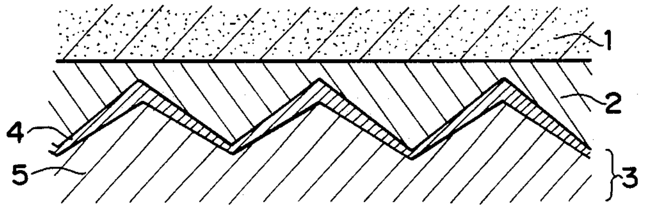
Figure 12C:
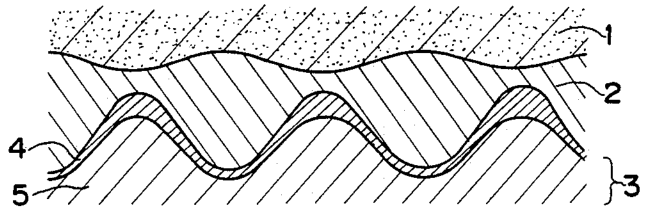

The jagged configuration may be selected from various configurations as shown in FIGS. 12(*a*), (*b*) and (*c*).

The above-indicated embodiment operates as described below.

As described above, the operative bias range of the prior art arrangement (FIG. 14) correspond to a depletion condition or a weak inverted condition of the semiconductor surface. Here the inversion indicates an inversion with respect to the semiconductor layer 5 of FIG. 14 but not an inversion with respect to the upper-most semiconductor layer 4. For example, in case that the semiconductor is a $p/n/n^+$ structure, generation of a charge layer of positive holes along the semiconductor surface is called "inversion' (in this case, it is an inversion for the n layer but not for the upper-most p layer). This situation also applies to explanation of the inventive arrangement of FIG. 8.

Figure 9A:
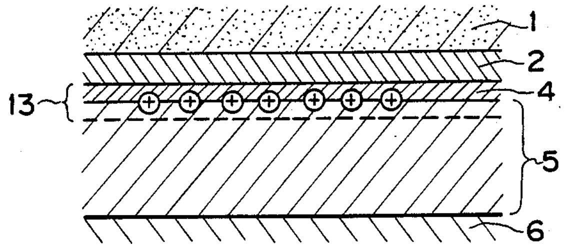
FIGS. 9 and 10 are cross-sectional views which show how the inverted charge layer is generated in the embodiment of FIG. 8.
Figure 9B:
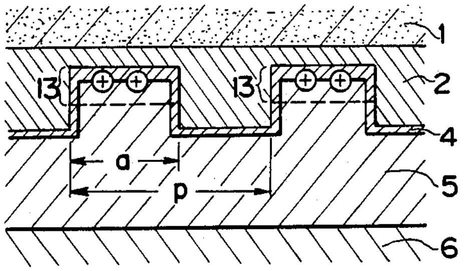

When a bias for changing the semiconductor surface into an inverted condition is applied in the prior art arrangement, a uniform inverted charge layer is produced along the semiconductor surface as shown in FIG. 9(*a*). As described above, in this case a loss caused by the Joule heat occurs in the inverted layer, and this results in an increase in the surface wave propagation loss and a decrease in the convolution efficiency. The semiconductor used in FIG. 9 has a $p/n/n^+$ structure.

On the other hand, in the jagged configuration as used in the aforegoing embodiment, it is recognized that distribution of inverted charges in the inverted condition is not an even distribution along the semiconductor surface but exhibits as if charges are caged in selected portions where the insulator is offset and thin as shown in FIG. 9(*b*).

Figures 10A, 10B, 10C, 10D, 10E, 10F:
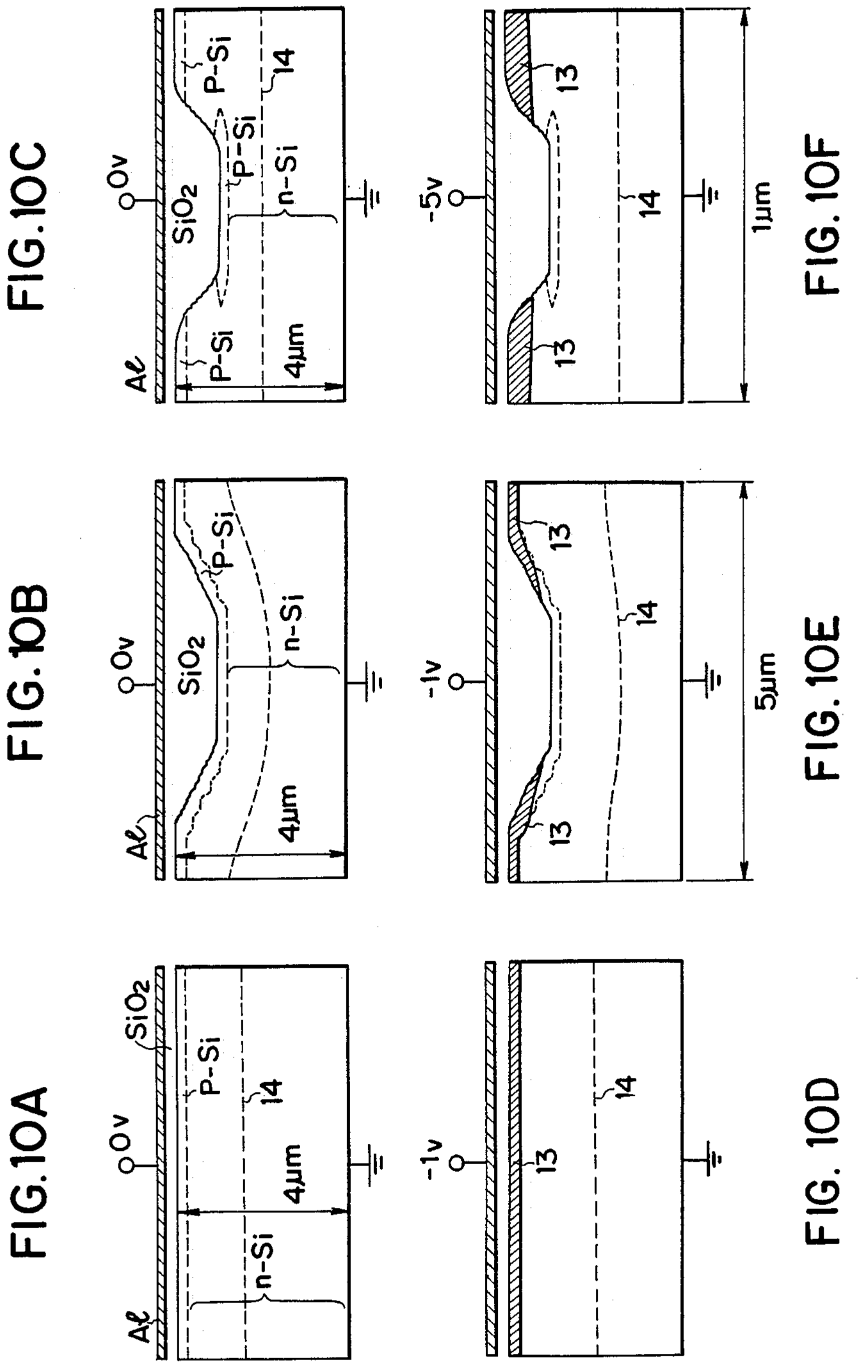

As particular examples, FIG. 10 shows different forms of distribution of inverted charges in a SAW convolver of Al/$SiO_2$/p—Si/n—Si structure which were obtained as a result of simulation. FIGS. 10(*b*) and (*c*) each show one period portion when assuming that the jagged structure is periodical, and numeral 14 denotes a depletion end. In this case, it is assumed that the donor density of n-Si is $2\times10^{14}cm^{-3}$. Further, the thickness of the p-Si layer is 0.2 $\mu$m, and the acceptor density is a value which changes the entire p layer into a depletion condition under zero bias. As will be understood from comparison between FIG. 10(*a*) of the prior art and FIGS. 10(*b*) and (*c*) of jagged structures, inverted charges (positive holes) in each jagged structure are distributed as if they were caged in selected portions where the insulator ($SiO_2$) is offset and thin. When in particular the jagged interval P is small as shown in FIG. 10(*c*), he caging effect is great, and also when the charges are biased deeply to the inverted side, the inverted layer is formed mainly in the portions where the insulator is thin. Although a practical convolver includes a piezoelectric film between the insulator ($SiO_2$) and metal (Al) of FIG. 10, the caging effect is substantially equal to FIG. 10.

When inverted charges are caged as described above, it is difficult for the inverted charges to move with respect to the surface potential, and as a result, the Joule heat generated in the inverted charge layer 13 is decreased as compared to the prior art arrangement.

Figure 11:
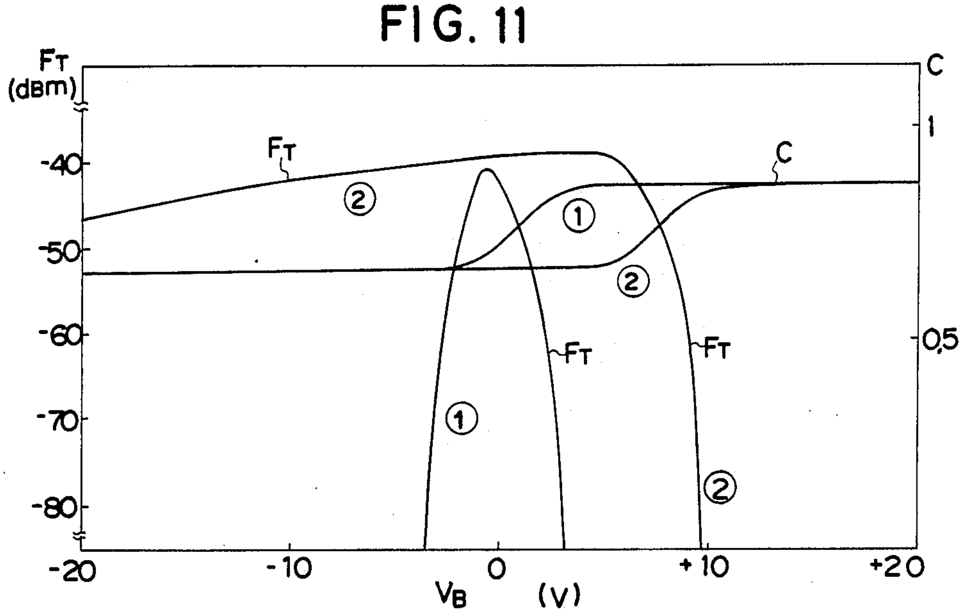
FIG. 11 is a graph which shows the convolution efficiency and the capacity with respect to a bias voltage in the embodiment of FIG. 8.

FIG. 11 shows different the bias characteristics of the convolution efficiency $F_T$ of the convolver which were obtained as a result of simulation. In FIG. 11, the C-V characteristic (capacitance-voltage characteristic) of the gate electrode 7 is also shown for comparison. FIG. 11 shows an example of the bias characteristic of a convolver having an arrangement of ZnO/$SiO_2$/p—Si/n+—si. In this example, the donor density of the n-Si layer is $2\times10^{14}cm^{-3}$, and the product of the acceptor density and the layer thickness of the p-Si layer (hereinafter called "dose amount") is different for 1 and 2 in FIG. 11. In the same drawing, 1 indicates changes in the convolution efficiency $F_T$ in the prior art arrangement (dose amount$=3\times10^{10}cm^{-2}$) and 2 indicates those in a jagged structure (a=0.5 $\mu$m, p=1 $\mu$m and dose amount$=1\times10^{11}cm^{-2}$). Further, the surface wave is Sezawa wave, the frequency is 215 MHz, and the gate length is 40 mm. The convolution efficiency $F_T$ is defined by Expression (2).

It is evident from FIG. 11 that the jagged structure of the second embodiment of the present invention makes it possible to not only activate the device under zero bias as in the prior art arrangement but also increase the operative bias range larger than the prior art arrangement. This is because unlike the prior art arrangement, the loss in the inverted layer, if formed along the semiconductor surface, is small, and a high hd T is maintained even under a bias which is deep in the inverted side. The nature that the operative bias range is wide indicates that the condition for zero bias operation of the element is readily established. More specifically, in order to operate the prior art arrangement of FIG. 14 under zero bias, the impurity density and the thickness of the upper-most semiconductor layer 4 must be set at values which change the entire upper-most layer 4 into a depletion condition under zero bias. In contrast, in the second embodiment of FIG. 8, a condition for inverting portions where the insulator is offset and thin as shown in FIG. 9(*b*) is also acceptable as a condition for effecting zero bias operation, in lieu of a condition for changing the upper-most semiconductor layer 4 into a depletion condition. This is because the operative bias range is extended to a bias which is deep in the inverted side in the jagged structure as described above. Such relaxation of the condition indicates that strict condition required in the prior art to obtain an element operative under zero bias in a wide temperature range is not necessary, and this leads to relaxation of the manufacturing condition and to an improvement of the manufacturing yield. It is noted that expansion of the operative bias range in the jagged structure occurs in the inverted side, and not in the accumulation side. Therefore, in order to effect zero bias operation, existence of the upper-most semiconductor layer 4 is indispensable as in the prior art arrangement.

Figure 15:
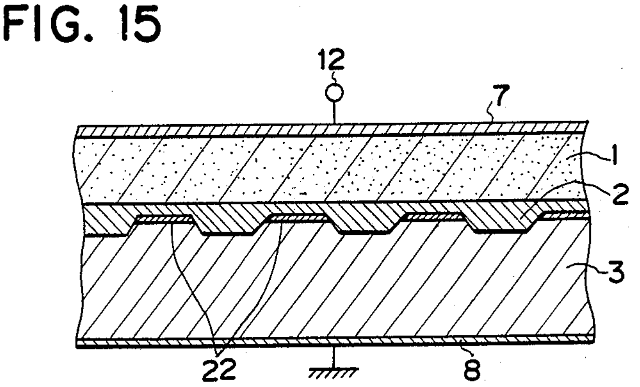
FIG. 15 is a fragmentary cross-sectional view of a SAW convolver taken as a further embodiment of the invention.
Figure 16:
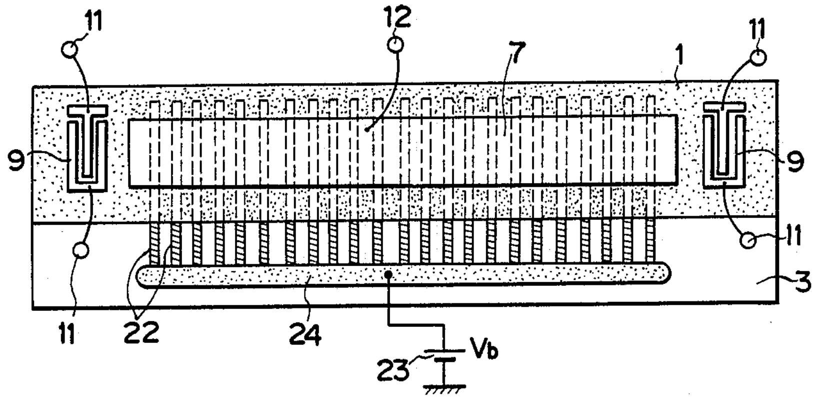
FIG. 16 is an upper view of the same convolver.

FIGS. 15 and 16 show an embodiment corresponding to the third invention. In the drawing, the same reference numerals as used in FIG. 23 indicate identical or equivalent elements to those of FIG. 23, and numeral 24 indicates a resistor.

Figure 23:
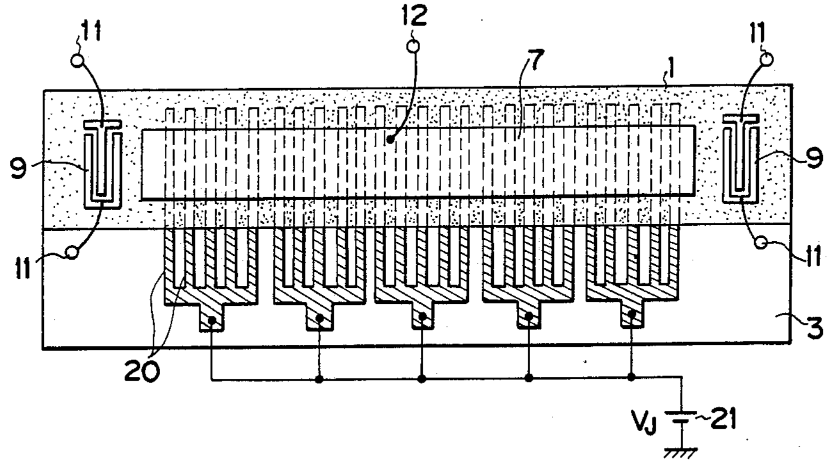
FIG. 23 PRIOR ART
FIGS. 23 and 24 are an upper view and a cross-sectional view of a still further prior art SAW convolver.
Figure 24:
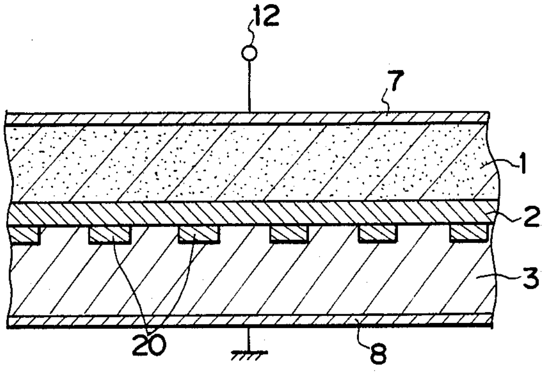
FIG. 24 PRIOR ART

A further difference between the inventive SAW convolver and the prior art arrangement of FIGS. 23 and 24 other than those indicated above is that the invention connects respective electrodes of a control electrode array 22 by the resistor 24 and connects a bias source 23 via the resistor 24. The control electrode in the present invention may be a high-concentrated semiconductor of a conduction type different from the conduction type of the semiconductor substrate 3 ($p^+$-type semiconductor when the semiconductor substrate is of n-type, and $n^+$-type semiconductor when the semiconductor substrate is of p-type) as in the prior art arrangement (FIG. 23) or may be made of metal. When metal is used as the control electrode, connection by the resistor 24 is indispensable as in the present invention. The reason thereof is explained in the later description regarding the operation. It is noted that junction between the control electrode and the semiconductor substrate is p/n junction when a high-concentrated semiconductor is used as the control electrode, whereas it is Schottky junction when metal is used as the control electrode.

Various materials may be used for the piezoelectric film, insulator, semiconductor, control electrodes and resistor in the present invention. For example, ZnO or AlN may be used as the piezoelectric film, $SiO_2$ or SiNx may be used as the insulator, and Si or GaAs may be used as the semiconductor. Further, in case of making the control electrode from metal, Al, Al/Ti, Au, etc. may be used, and the resistor may be formed by spreading impurities in the semiconductor substrate or accumulating a thin layer of amorphous Si.

Figure 17:
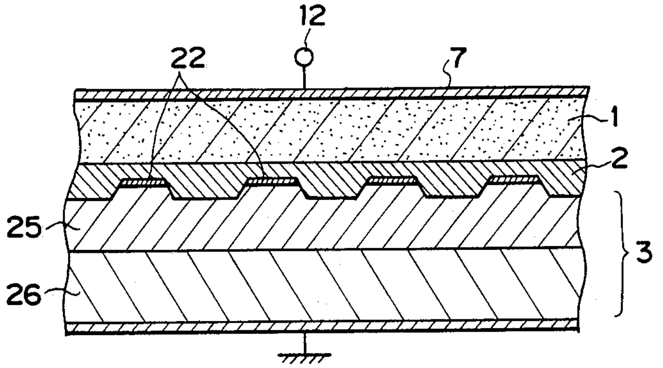
FIG. 17 is a fragmentary cross-sectional view of a SAW convolver taken as a still further embodiment of the invention.

The semiconductor substrate may be an epitaxial substrate made by epitaxial growth of a low-concentrated semiconductor 25 on a high-concentrated semiconductor substrate 26 as shown in FIG. 17 (n/n+ substrate or p/p+ substrate). The propagation loss of a surface wave travelling in the convolver is smaller in the use of the epitaxial substrate of FIG. 17 than in the use of a bulk substrate, and as a result, the convolution efficiency is larger when the epitaxial substrate is used. Therefore, the use of the epitaxial substrate is more advantageous practically.

Figure 18:
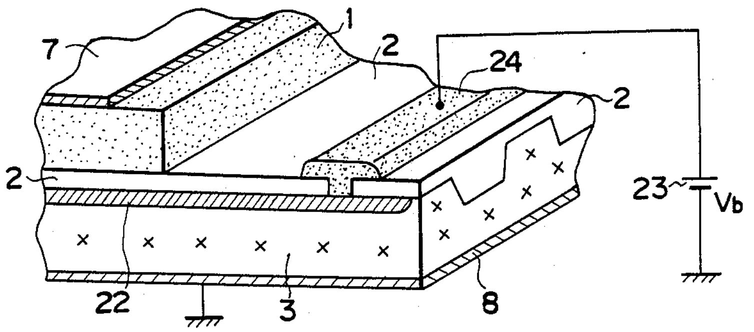
FIG. 18 is a fragmentary cross-sectional view of a SAW convolver taken as a yet further embodiment of the invention.

The surface of the semiconductor substrate at portions not having the piezoelectric film 1 thereon may be coated by the insulator 2 as shown in FIG. 18.

Figure 19:
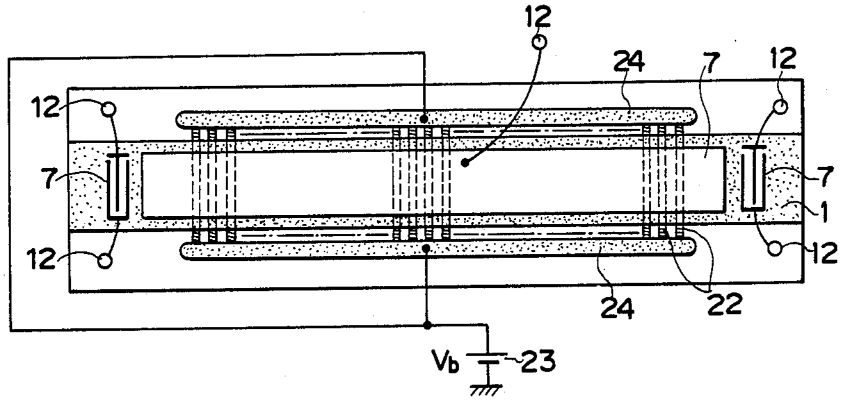
FIG. 19 is an upper view of a SAW convolver taken as a yet further embodiment of the invention.

An arrangement of FIG. 19 may be used in lieu of the arrangement of FIG. 17 to apply a bias voltage $V_b$ to the control electrode array 22. The arrangement of FIG. 19 is a modification where the bias voltage $V_b$ from the bias source 23 is applied to opposite ends of the control electrode array 22 via the resistor 24.

The above-described embodiment operates as described below.

This convolver is an improvement of the prior art arrangement of FIG. 13 which has been improved to establish an immediate response to the control bias and a high convolution efficiency as well.

In the inventive SAW convolver shown in FIGS. 17 and 18, the control bias source 23 applies a bias voltage $V_b$ to the control electrode array 22 to control the surface condition of the semiconductor 3 directly and not via the piezoelectric film 1. Therefore, while maintaining the nature of immediate response against application of the control bias voltage as in the prior art arrangement, the characteristic of the device is stabilized in a short time.

On the other hand, establishment of a higher convolution efficiency in the aforegoing convolver than in the prior art arrangement is a result of two improvements using the jagged configuration of the insulator 2 and connection of the control electrode array 22 via the resistor 24. The following passages explain how these improvements are effective for increasing the convolution efficiency.

Figure 20A:
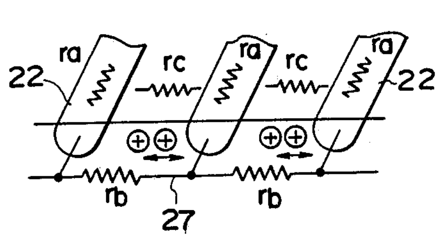
FIG. 20 show circuits equivalent to control electrodes of an inventive SAW convolver.
Figure 20B:
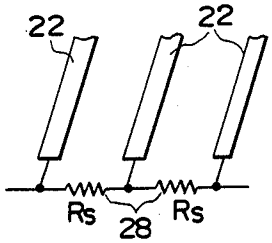

In the prior art and inventive arrangements having a control electrode array, resistance $r_b$ of the conduction member connecting the electrodes, resistance $r_c$ caused by the surface carrier of the semiconductor and resistance $r_a$ of the electrodes themselves are present between adjacent electrodes as shown in FIG. 20 (*a*) and adjacent electrodes whole be regarded to be linked by a coupling resistance $R_2$ as shown in FIG. 20(*b*). In FIG. 20, 27 refers to a surface carrier, 28 to a coupling resistance, (a) is an equivalent circuit indicated by respective elements, and (b) is an equivalent circuit indicated by the coupling resistance. Here, $$R_s = \frac{r_c\,(r_a + r_b)}{r_a + r_b + r_c} \qquad (3)$$

Figure 21:
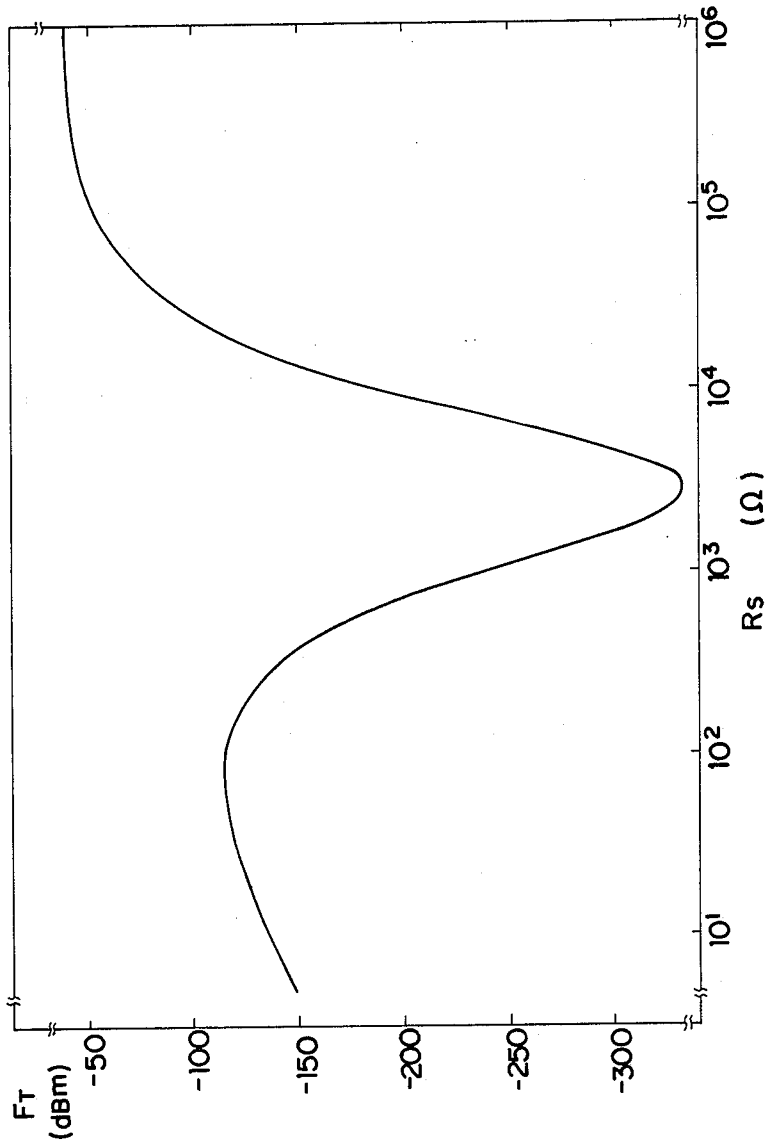
FIG. 21 is a graph which shows the relationship between the coupling resistance and the convolution efficiency $F_t$.

Studying the influence of the coupling resistance $R_s$, it is recognized that $R_s$ gives large influence to the convolution efficiency $F_T$. FIG. 21 shows a relationship between $R_s$ and $F_T$. This is an example of the characteristic of a convolver of ZnO/$SiO_2$/n-Si structure. In this example, the donor density of Si is $2\times10^{14}cm^{-3}$, the gate length is 40 mm, the width of the control electrode is 2.5 μm and the period or interval of the control electrode is 5 μm. Further, the surface wave is Sezawa wave, and the frequency is 215 MHz. It is noted that $F_T$ is defined by the following equation:

$$F_T = P_{out} - P_1 - P_2 \qquad (4)$$

where $P_1$ and $P_2$ indicate input power to two comb-shaped electrodes, and $P_{out}$ is output power from the gate electrode. All these amounts are shown in dBm.

It is evident from FIG. 21 that $F_T$ is minimum when $R_s$ is several kΩ approximately. Further, it is recognized that in order to obtain a high value of $F_T$ above −50 dBm under 40 mm gate, a large resistance above 100 kΩ is required as the coupling resistance $R_S$. Therefore, in order to increase the convolution efficiency $F_T$ it is preferred to use an arrangement where $R_S$ is as large as possible. The invention employs the jagged configuration of the insulator and connects the control electrodes by the resistor just for increasing $R_S$ as far as possible.

Figure 22B:
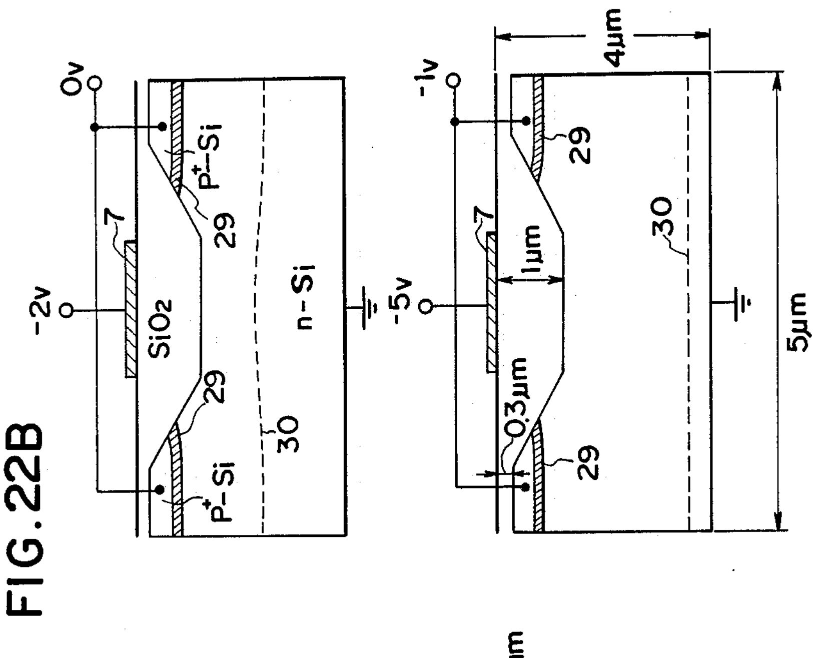
FIG. 22 is a cross-sectional view for explaining how an inverted layer is generated.
Figure 22A:
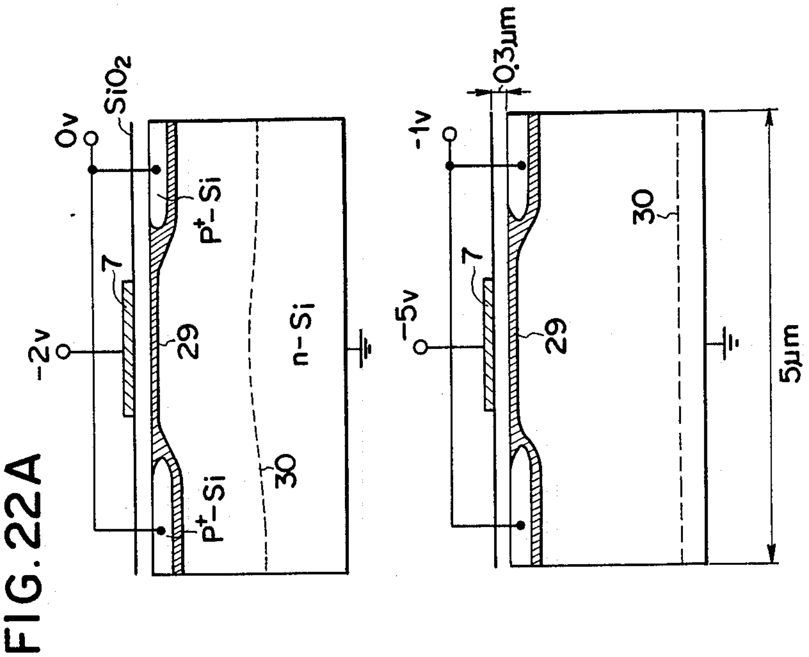

One of factors giving large influence to $R_s$ is the resistance $r_c$ caused by surface carriers of the semiconductor as shown in FIG. 20 and Expression 3. In order to increase $r_c$ as far as possible, it is necessary to change the semiconductor surface into a depletion condition and prevent generation of an inverted layer caused by minority carriers. The aforegoing embodiment employs the jagged configuration of the insulator 2 and locates the control electrode array 22 at portions where the insulator is thin (or at portions where the insulator is offset toward the piezoelectric film as viewed from the semiconductor side) because the arrangement is advantageous for removing minority carriers from the semiconductor surface FIG. 22 shows a result of comparison between distribution of an inverted layer caused by minority carriers in the prior art arrangement (a) and that in the inventive jagged structure (b) both obtained by simulation. In FIG. 22, reference numeral 29 refers to an inverted layer, and 30 to a depletion layer. FIG. 22 shows an example where the control electrode of p+-Si (acceptor density of $10^{18}cm^{-3}$ and thickness of 0.4 μm) is provided on a Si substrate of donor density $2\times10^{14}cm^{-3}$. It is evident from FIG. 22 that no inverted layer is produced between electrodes in the jagged structure even in case that an inverted layer is formed between control electrodes in the prior art arrangement. If an inverted layer is formed between electrodes, $r_c$ readily drops below several kΩ, and $R_s$ also drops below several kΩ as evident from Expression (3). This results in a large decrease of the convolution efficiency $F_T$ as shown in FIG. 21. Therefore, the use of the inventive jagged structure is more advantageous for removal of minority carriers than the use of the prior art arrangement, and the invention can therefore increase the efficiency $F_T$ rather than the prior art arrangement. It is for the aforegoing reasons that the invention employs the jagged structure of the insulator. Although FIG. 22 shows an example in the form of p/n junction, Schottky junction using metal as the control electrode is identical qualitatively. In this case, also, the inventive jagged structure can increase the efficiency $F_T$ more than the prior art arrangement.

Other factors which affect $R_s$ are $r_a$ and $r_b$ in FIG. 20 and Expression (3). The resistance $r_a$ of the control electrode itself depends on what is selected as the electrode material. When a high-concentrated semiconductor is selected as the control electrode, it is possible to increase $r_a$ to 100 kΩ or more by selecting an appropriate impurity density and an appropriate thickness of the control electrode. As a result, $R_s$ can be increased to a sufficiently large value as evident from Equation (3). However, when Al or other metal is selected as the control electrode, $r_a$ is decreased to several Ω or less, and $R_s$ cannot be increased sufficiently unless the $r_b$ of the conductor is increased, as evident from Expression (3). In order to increase $r_b$, a resistor must be used in lieu of the conductor. Therefore, particularly when metal is used as the control electrode, it is indispensable to connect respective electrodes by the resistor 24. These are major reasons why the aforegoing embodiment connects the electrodes 22 by the resistor 24. If a high-concentrated semiconductor is employed as the control electrode 22 and the resistance of the electrode itself is increased sufficiently, respective electrodes may be connected by a low-resistance conductor such as metal, not using a resistor. However, in order to increase the resistance of the control electrode, it is necessary to somewhat decrease the impurity density or decrease the thickness of the electrode, and this often decreases the manufacturing yield. In this case, however, even when a high-concentrated semiconductor is selected as the control electrode 22, connection between respective electrodes by the resistor makes it possible to increase $R_s$ accordingly, and the condition for manufacturing the high-concentrated semiconductor can be relaxed. Therefore, in the aforegoing embodiment, connecting the control electrodes 22 by the resistor 24 is indispensable not only when metal is selected as the control electrodes but also when a high-concentrated semiconductor is selected.

As described above, various materials may be selected as the piezoelectric film, insulator and semiconductor used in the aforegoing embodiment. However, in order to increase the electromechanical coefficient of a surface wave travelling through the convolver, it is preferable to use an arrangement of $ZnO/SiO_2/Si$ and use Sezawa wave as the surface wave propagating mode. In this case, (110)-surface of Si with [100]-direction of propagation of a surface wave is quite advantageous because it can increase in particular the electromechanical coefficient. Additionally, (100)-surface of Si with [110]-direction of propagation of a surface wave establishes quite a large electromechanical coupling coefficient, and it is therefore an advantageous condition next to the said condition.

The invention may be used in all devices using a SAW convolver. More specifically, it may be used in correlators, SSC transmitters, radars, image prosessors, Fourier transformers, etc.

As described above, according to the first invention, it is possible to significantly enlarge the operative bias range as compared to the prior art arrangement. Expansion of the operative bias range facilitates bias adjustment also when the device is operated in a wide temperature range, and strict bias adjustment required in the prior art arrangement is not necessary. Further, such a wide operative bias range decreases changes in the convolution output caused by changes in the circumstances other than the temperature, changes of the element with time, changes in the output of the external bias circuit, etc.

According to the second embodiment, since a convolver is operative under zero bias and has a wide operative bias range, no external bias source is required, and the manufacturing yield improved.

According to the third invention, since a convolver is responsive immediately to a bias and has an excellent efficiency, it is possible to provide a convolver-using system which does not require any warming-up time and decreases the power consumption.

What is claimed is:

1. A surface-acoustic-wave convolver, comprising:
a multi-layer structure which includes a piezoelectric layer, an insulation layer and a semiconductor layer;
at least one comb-shaped electrode and a gate electrode which are both provided on said piezoelectric layer; and
an interface formed between said insulation layer and said semiconductor layer in the form of a jaggedness, said jaggedness being formed periodically in the traveling direction of a surface wave.

2. The surface-acoustic-wave convolver according to claim 1, wherein said multi-layer structure includes a further semiconductor layer of a first conduction type, said first-mentioned semiconductor layer being of a second conduction type.

3. A surface-acoustic-wave convolver, comprising:
a multi-layer structure which includes a piezoelectric layer, an insulation layer and a semiconductor layer;
at least one comb-shaped electrode and a gate electrode which are both provided on said piezoelectric layer; and
an interface formed between said insulation layer and said semiconductor layer in the form of a jaggedness;
wherein said jaggedness is formed under said gate electrode and periodically meanders in a surface wave propagation direction.

4. The surface-acoustic-wave convolver according to claim 3 wherein the period P of said jaggedness has the following relationship with the wavelength λ of a surface wave:

$$m \cdot \frac{\lambda}{2} < P < (m+1) \cdot \frac{\lambda}{2}$$

where m indicates a positive integer including 0.

5. The surface-acoustic-wave convolver according to claim 1, wherein said jaggedness is in the form of gun eyes.

6. The surface-acoustic-wave convolver according to claim 1, wherein said jaggedness is in the form of saw teeth.

7. The surface-acoustic-wave convolver according to claim 1, wherein said jaggedness is in the form of waves.

8. The surface-acoustic-wave convolver according to claim 2 wherein said first conduction type is p-type, and said second conduction type is n-type.

9. The surface-acoustic-wave convolver according to claim 2 wherein said first conduction type is n-type, and said second conduction type is p-type.

10. The surface-acoustic-wave convolver according to claim 1, wherein said semiconductor layer is Si, and Sezawa wave is used as a surface wave.

11. The surface-acoustic-wave convolver according to claim 10 wherein the surface orientation of Si is (110), and the propagating direction is [100].

12. The surface-acoustic-wave convolver according to claim 10 wherein the surface orientation of Si is (100), and the propagating direction is [110].

13. A surface-acoustic-wave convolver according to claim 1, including a control electrode array having electrodes formed along said interface at portions where said insulation layer is offset and thin.

14. The surface-acoustic-wave convolver according to claim 13 wherein said electrodes of said control electrode array are made from a high-concentrated semiconductor of the same material as and of a different conduction type from said semiconductor layer.

15. The surface-acoustic-wave convolver according to claim 13 wherein said electrodes of said control electrode array are made from metal to form a Schottky junction between said semiconductor layer and each said control electrode.

16. The surface-acoustic-wave convolver according to claim 14 or 15 wherein respective said electrodes of said control electrode array are connected by a resistor on said semiconductor layer.

17. The surface-acoustic-wave convolver according to claim 13, wherein said semiconductor layer is one of an n-type semiconductor/$n^+$-type semiconductor arrangement and a p-type semiconductor/$p^+$-type semiconductor arrangement.

18. The surface-acoustic-wave according to claim 17 wherein said semiconductor layer is made from Si.

19. The surface-acoustic-wave convolver according to claim 17 wherein said semiconductor layer is made from GaAs.

20. The surface-acoustic-wave convolver according to claim 17 wherein said insulation layer is made from $SiO_2$.

21. The surface-acoustic-wave convolver according to claim 17 wherein said insulation layer is made from SiNx.

22. The surface-acoustic-wave convolver according to claim 20 wherein said piezoelectric layer is made from ZnO.

23. The surface-acoustic-wave convolver according to claim 20 wherein said piezoelectric layer is made from AlN.

24. The surface-acoustic-wave convolver according to claim 22 wherein said semiconductor layer is made from Si and Sezawa wave is used as a surface wave.

25. The surface-acoustic-wave convolver according to claim 24 wherein the surface orientation of Si is (110), and the propagating direction is [100].

26. The surface-acoustic-wave convolver according to claim 24 wherein the surface orientation of Si is (100), and the propagating direction is [110].

27. A surface-acoustic-wave convolver, comprising:

a multi-layer structure which includes a piezoelectric layer, an insulation layer, a semiconductor layer of a first conduction type and a semiconductor layer of a second conduction type;

at least one comb-shaped electrode and a gate electrode which are both provided on said piezoelectric layer; and an interface formed between said insulation layer and said first conduction type semiconductor layer in the form of a jaggedness;

wherein said jaggedness is formed under said gate electrode and periodically meanders in a surface wave propagation direction.

28. The surface-acoustic-wave convolver according to claim 27, wherein the period P of said jaggedness has the following relationship with the wavelength λ of a surface wave:

$$m\cdot\frac{\lambda}{2} < P < (m+1)\cdot\frac{\lambda}{2}$$

where m indicates a positive integer including 0.

29. The surface-acoustic-wave convolver according to claim 21, wherein said piezoelectric layer is made from ZnO.

30. The surface-acoustic-wave convolver according to claim 21, wherein said piezoelectric layer is made from AlN.

31. The surface-acoustic-wave convolver according to claim 29, wherein said semiconductor is made from Si and Sezawa wave is used as a surface wave.

32. The surface-acoustic-wave convolver according to claim 31, wherein the surface orientation of Si is (110), and the propagating direction is [100].

33. The surface-acoustic-wave convolver according to claim 31, wherein the surface orientation of Si is (100), and the propagating direction is [110].

34. A surface-acoustic-wave convolver, comprising: a piezoelectric layer, an insulation layer, and a semiconductor layer, said insulation layer being disposed between said piezoelectric layer and said semiconductor layer for introducing surface acoustic waves into said convolver, output electrode means provided on said piezoelectric layer for producing an output signal in response to surface acoustic waves in said convolver, wherein said insulation layer has on a side thereof facing said manner in a direction parallel to a direction of travel of surface acoustic waves, said semiconductor layer having projecting portions which each extend into a respective said recess in said insulation layer.

35. A surface-acoustic-wave convolver according to claim 34, wherein said recesses in said insulation layer are elongate groovelike recesses extending parallel to each other and substantially perpendicular to said direction of travel of surface acoustic waves, and wherein said upwardly projecting portions of said semiconductor layer are each a rib which extends substantially perpendicular to said direction of travel of surface acoustic waves.

36. The surface-acoustic-wave convolver according to claim 35, wherein each said rib and each said recess has a cross sectional shape which is substantially rectangular.

37. The surface-acoustic-wave convolver according to claim 35, wherein each said rib and each said recess has a cross sectional shape which is substantially triangular.

38. The surface-acoustic-wave convolver according to claim 35, wherein each said rib and each said recess has a cross sectional shape which is sinusoidal.

39. The surface-acoustic-wave convolver according to claim 35, including a plurality of control electrodes provided between said insulation layer and said semiconductor layer, each said control electrode being disposed within a respective one of said recesses.

40. The surface-acoustic-wave convolver according to claim 39, including a strip of resistive material which is connected at respective spaced locations to each of said control electrodes.

41. The surface-acoustic-wave convolver according to claim 40, wherein said control electrodes are elongate, wherein said first-mentioned strip is connected to each said control electrode at one end thereof, and including a further strip of resistive material which is connected at spaced locations therealong to an end of each said control electrode remote from the end thereof connected to said first-mentioned strip.

42. The surface-acoustic-wave convolver according to claim 34, including a further semiconductor layer provided between said insulation layer and said first-mentioned semiconductor layer.

* * * * *

UNITED STATES PATENT AND TRADEMARK OFFICE

CERTIFICATE OF CORRECTION

PATENT NO. : 4 967 113

DATED : October 30, 1990

INVENTOR(S) : Syuichi MITSUTSUKA

It is certified that error appears in the above-identified patent and that said Letters Patent is hereby corrected as shown below:

Column 16, line 40; after "said" insert ---semi-conductor layer a plurality of recesses spaced in a periodic---.

Signed and Sealed this

Twenty-sixth Day of May, 1992

*Attest:*

DOUGLAS B. COMER

*Attesting Officer*

*Acting Commissioner of Patents and Trademarks*